(12) United States Patent
Uesaka et al.

(10) Patent No.: US 8,216,866 B2
(45) Date of Patent: Jul. 10, 2012

(54) METHOD TO MANUFACTURE SEMICONDUCTOR DEVICE WITH OPTICAL GRATING

(75) Inventors: Katsumi Uesaka, Yokohama (JP); Kuniaki Ishihara, Yokohama (JP); Yutaka Oonishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/903,547

(22) Filed: Oct. 13, 2010

(65) Prior Publication Data

US 2012/0094402 A1    Apr. 19, 2012

(51) Int. Cl.
*H01L 21/00* (2006.01)
*G01R 31/26* (2006.01)

(52) U.S. Cl. ............... 438/32; 438/16; 438/27; 438/29; 257/E21.529

(58) Field of Classification Search ........................ None
See application file for complete search history.

(56) References Cited

U.S. PATENT DOCUMENTS

| | | | | |
|---|---|---|---|---|
| 5,084,894 A | * | 1/1992 | Yamamoto | 372/50.22 |
| 5,303,255 A | * | 4/1994 | Kudo et al. | 372/96 |
| 2001/0008539 A1 | * | 7/2001 | Kudo | 372/50 |
| 2004/0156411 A1 | * | 8/2004 | Sakata | 372/50 |

OTHER PUBLICATIONS

Takagi, et al., "120°C 10-Gb/s Uncooled Direct Modulated 1.3- μm AlGaInAs MQW DFB Laser Diodes", IEEE Photonics Technology Letters, vol. 16, pp. 2415-2417, 2004.

* cited by examiner

*Primary Examiner* — Seahvosh Nikmanesh
(74) *Attorney, Agent, or Firm* — Smith, Gambrell & Russell, LLP

(57) ABSTRACT

A method to manufacture an optical device with enhanced high frequency performance is disclosed. The method includes steps of: (a) forming semiconductor layers on a semiconductor substrate, (b) etching the semiconductor layers by using a mask to form a plurality of diffraction gratings, where the mask provides a plurality of periodic patterns each corresponding to respective gratings and having a specific pitch different from others, (c) forming an active layer on the etched semiconductor layers, (d) measuring a maximum optical gain of the active layer, (e) selecting one of diffraction gratings based on the measured optical gain, and (f) forming a current confinement structure aligned with the selected diffraction grating.

10 Claims, 15 Drawing Sheets

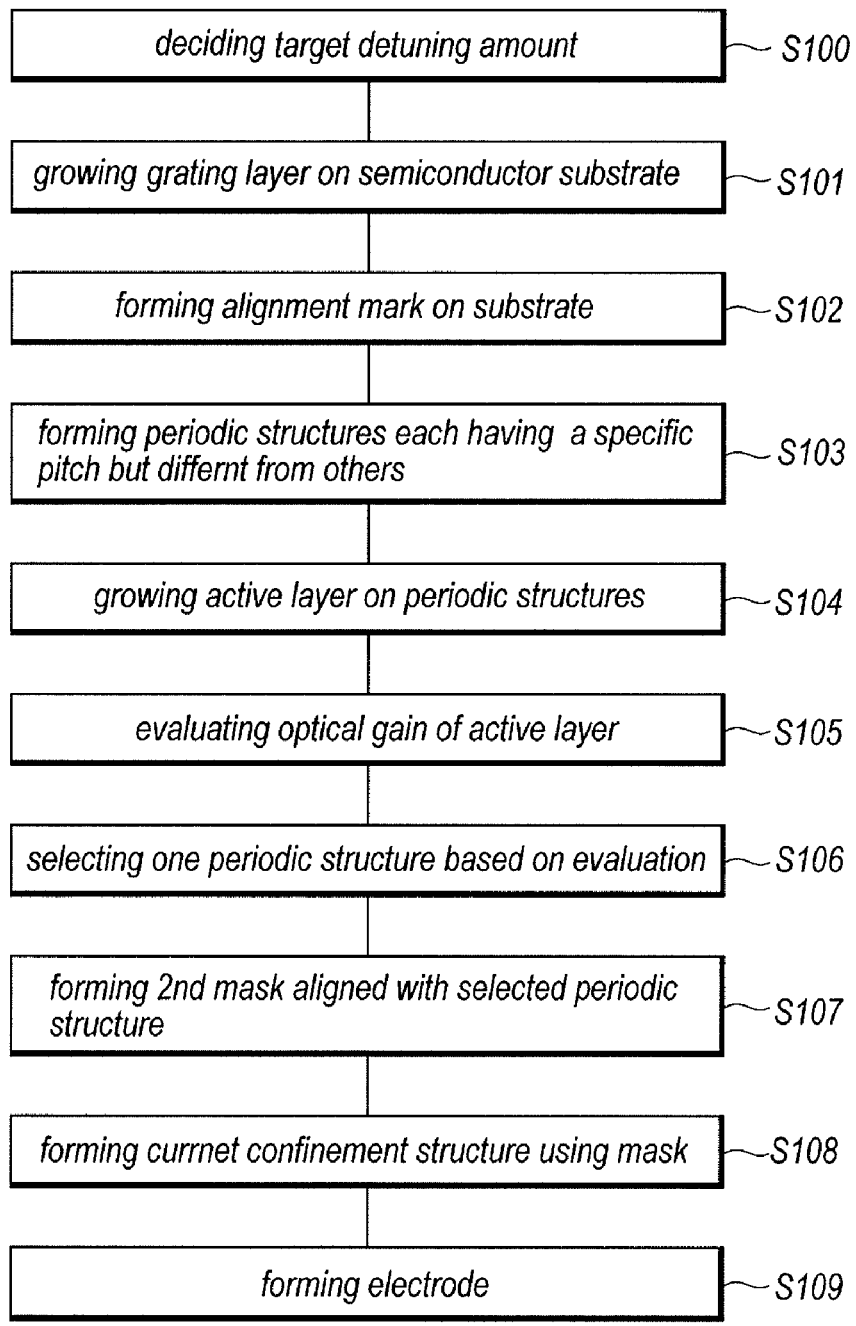

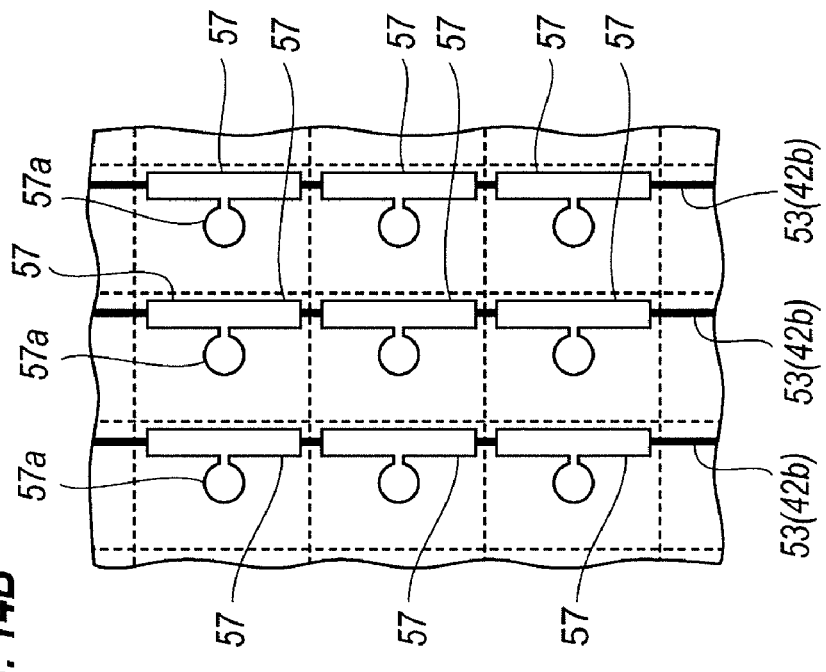
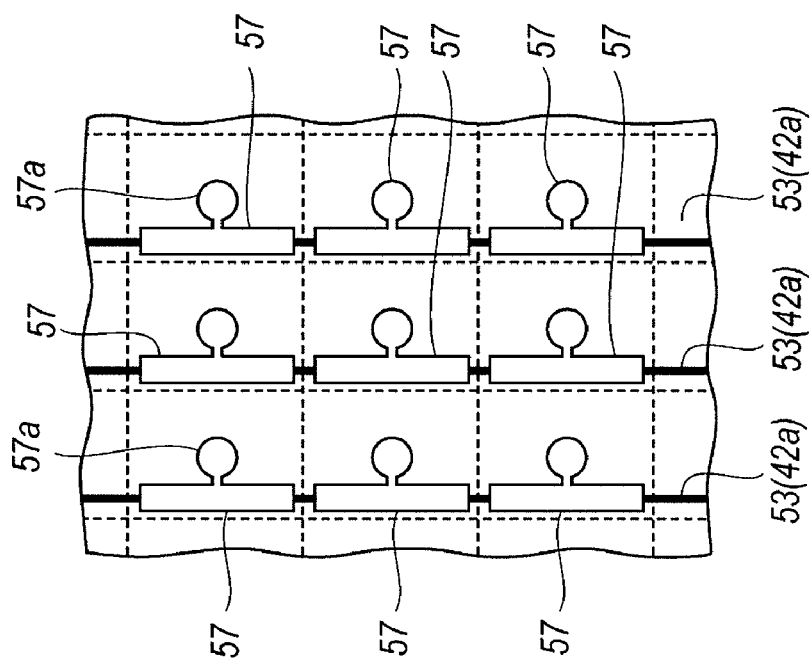

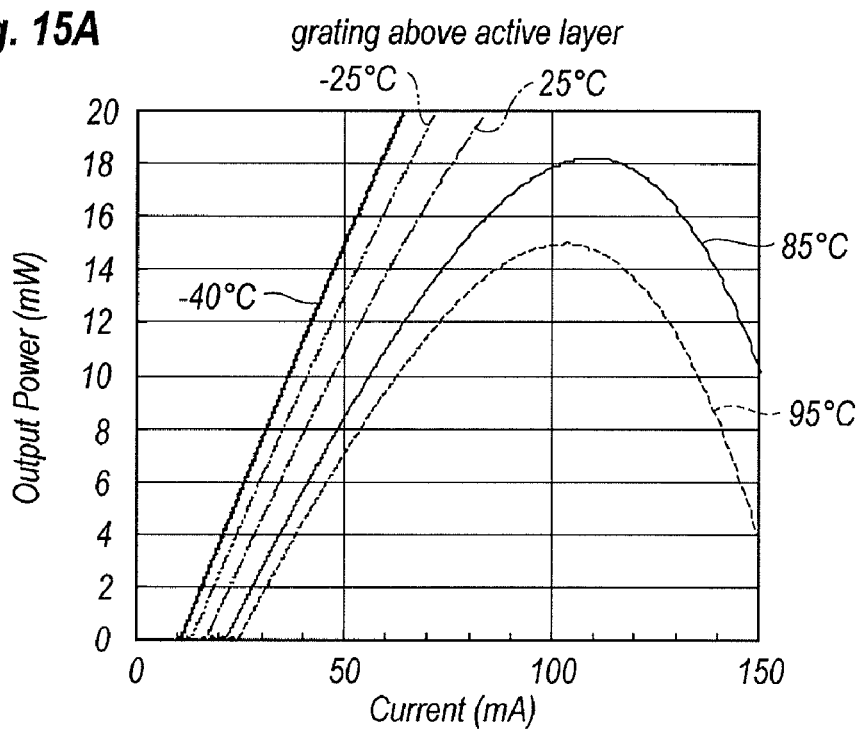
Fig. 15A  grating above active layer
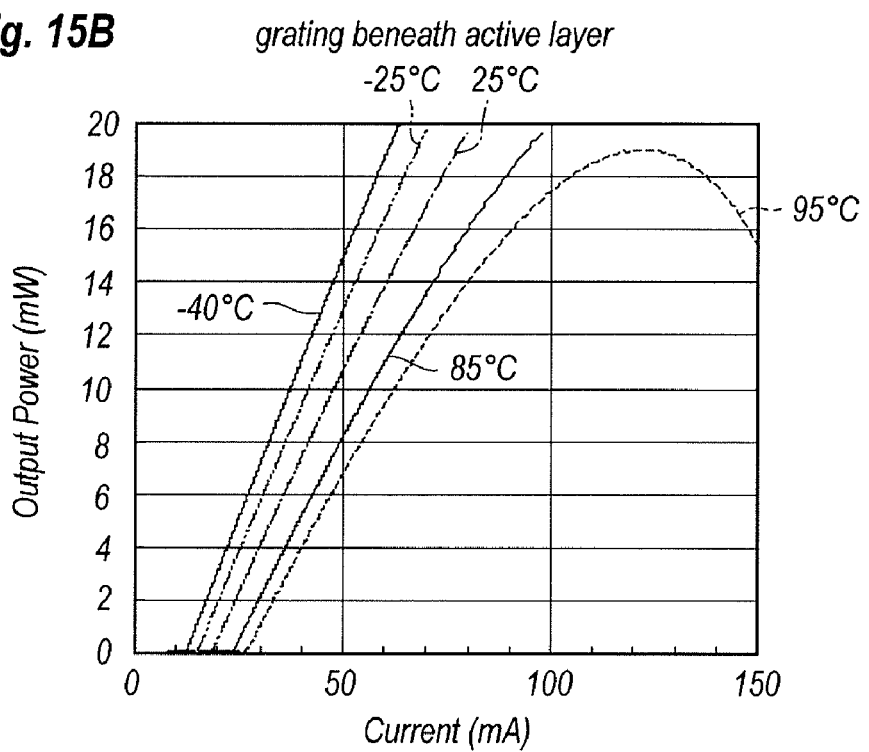
Fig. 15B  grating beneath active layer

METHOD TO MANUFACTURE SEMICONDUCTOR DEVICE WITH OPTICAL GRATING

BACKGROUND OF THE INVENTION

1. Field of the Invention

The present invention relates to a method to manufacture a semiconductor optical device, in particular, the invention relates to a method to manufacture a semiconductor light-emitting device with an diffraction grating.

2. Related Prior Arts

Photonics technology letters has disclosed a distributed feedback laser diode (hereafter denoted as DFB-LD) in a volume 16, pages from 2415 to 2417, published in 2004. The DFB-LD disclosed therein includes an active layer made of AlGaInAs and a diffraction grating between the active layer and an n-type InP substrate.

The relaxation frequency of a semiconductor LD strongly affects high-frequency performance of the LD. The DFB-LD has been requested in the performance thereof to enhance the relaxation frequency as high as possible in an operable temperature range. It is effective for enhancing the relaxation frequency to set a difference between the Bragg diffraction wavelength, which is determined by the pitch of the diffraction grating implemented in the LD and decides the oscillation wavelength of the DFB-LD, and a peak wavelength of the optical gain in the active layer within a characteristic range. This difference is often called as the detuning amount.

A DFB-LD, where the diffraction grating thereof is formed after the growth of the active layer, may adjust the pitch of the diffraction grating based on characteristics of the active layer, which may eliminate the fluctuation or the variation of the oscillation wavelength of the DFB-LD caused by the instability of the growth of the active layer.

However, the diffraction grating of the DFB-LD is often implemented between the n-type InP and the active layer to improve the temperature dependence and the high frequency performance of the DFB-LD. In such a DFB-LD, the diffraction grating is foamed before the growth of the active layer, and the pitch of the diffraction grating may be determined based on an estimation of the characteristic of the active layer grown subsequent to the diffraction grating. Therefore, when the characteristic of the active layer, for instance, the composition thereof, becomes out of the estimation; the detuning amount shifts from the designed value. The peak wavelength of the optical gain in the active layer generally shows a variation of a few nano-meters. The DFB-LD with the diffraction grating formed in advance to the formation of the active layer inherently has a variation of the detuning amount around a few nano-meters.

The present invention is to provide a method to manufacture an DFB-LD with the diffraction grating formed in advance to the formation of the active layer, in which the DFB-LD according to the present invention shows an improved high-frequency performance.

SUMMARY OF THE INVENTION

An aspect of the present invention relates to a method to manufacture a semiconductor optical device that includes a diffraction grating and an active layer arranged above the diffraction grating. Specifically, the active layer is formed after the formation of the diffraction grating. The method according to the present invention comprises steps of: (a) forming semiconductor layers on a semiconductor substrate, (b) etching the semiconductor layers by using an etching mask to form a plurality of diffraction gratings each having a specific pitch, (c) forming an active layer on the etched semiconductor layers, (d) measuring a peak wavelength of the optical gain in the active layer, (e) selecting one of the diffraction grating provided in the semiconductor layers, and (f) forming a current confinement structure which is aligned with the selected diffraction grating.

According to the method of the present invention, because a plurality of diffraction gratings are prepared and one of the diffraction gratings may be selected from the plurality of the diffraction gratings depending on the peak wavelength of the optical gain practically measured after the formation of the active layer. Accordingly, even when the peak wavelength of the optical gain shifts from the designed wavelength due to, for instance, instability of the crystal growth of the active layer, the optimum detuning amount may be obtained.

The etching mask used to form the diffraction gratings may be formed by the nano-imprint technique, the EB exposure or the interference exposure. The nano-imprint technique may include steps of, forming an insulating film on the semiconductor layers, forming a resin body on the insulating film, stamping a mold on the resin body, hardening the resin body as the mold is pressed against the resin body, and etching the insulating film by the patterned resin body as an etching mask, where the mold provides a plurality of periodic patterns each corresponding to the diffraction gratings to be formed in the semiconductor layers.

The process of the invention may further provide a step of preparing an alignment mark in the semiconductor layers. The stamping of the mold in the nano-imprint technique may refer to the alignment mark. Moreover, the mold may include another alignment mark which is reflected in the semiconductor layers by the etching. The step of forming the current confinement structure may refer to the other alignment mark formed in concurrent with the formation of the diffraction gratings.

The process of the invention may omit the first preparation of the alignment mark, and only refers the second alignment mark formed in concurrent with the formation of the diffraction gratings in the step of forming the current confinement structure.

BRIEF DESCRIPTION OF THE DRAWINGS

The foregoing and other purposes, aspects and advantages will be better understood from the following detailed description of a preferred embodiment of the invention with reference to the drawings, in which:

FIG. 1 is a flowchart showing step of the method to manufacture the semiconductor optical device;

FIGS. 14A and 14B show the arrangement of the electrode of the optical device according to the embodiment of the invention, where the devices each shown in FIG. 14A and FIG. 14B has different diffraction gratings; and FIGS. 15A and 15B compare the I-L characteristics of the optical device with a grating above the active layer (FIG. 15A) and the device with the grating beneath the active layer (FIG. 15B).

DETAILED DESCRIPTION OF PREFERRED EMBODIMENTS

Next, preferred embodiments according to the present invention will be described as referring to accompanying drawings. In the description of the drawings, the same numerals or the symbols will refer to the same elements without overlapping explanations.

FIG. 1 is a flow chart describing the manufacturing process according to an embodiment for a semiconductor optical device. The description presented below concentrates the optical device on a type of, what is called, the distributed feedback laser diode (DFB-LD). The diffraction grating showing the function of the distributed feedback may be formed by, as described below, the electron beam exposure (EB-exposure), the interference exposure or the nano-imprint technique, while, the semiconductor layers implemented in the DFB-LD may be formed by, for instance, the organic-metal vapor phase epitaxy (OMVPE) technique.

Referring to FIG. 1, step S100 determines the amount of the detuning and step S101 prepares a semiconductor substrate 11. This substrate 11 may be made of InP, GaAs and the like preferably with the n-type conduction. The n-type substrate makes it possible to provide the diffraction grating between the active layer and the n-type substrate, which may be escaped from large resistance inevitably caused in the arrangement where the diffraction grating is put between the p-type semiconductor layer and the active layer. Although a higher density of the p-type dopant may suppress the increase of the resistance, the p-type layer with the high density of the p-type dopant is unavoidable to show the large optical absorption.

Figure 2A:
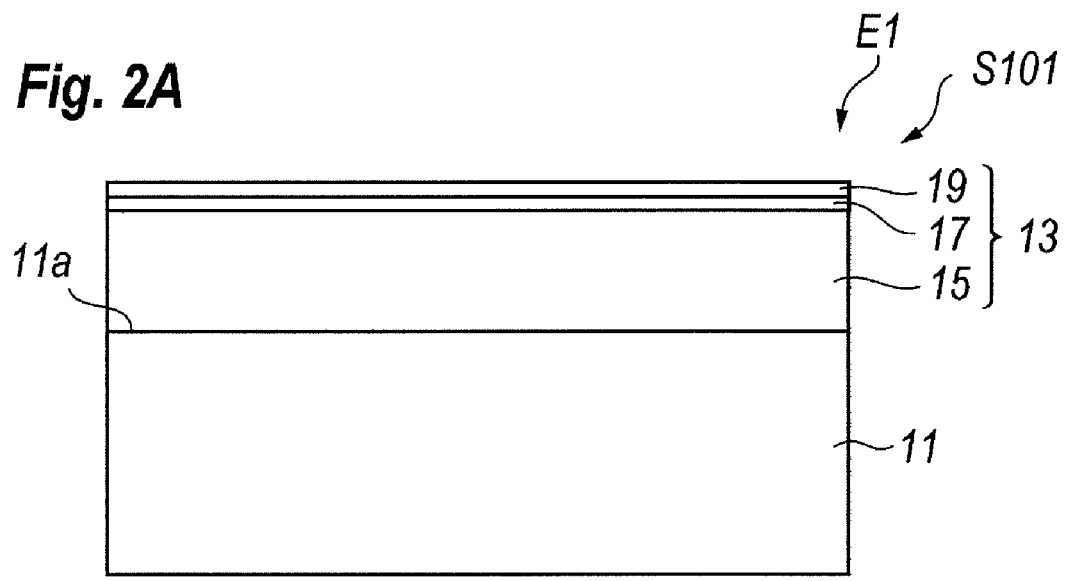
FIGS. 2A and 2B are cross section each showing steps of the manufacturing method according to one embodiment of the invention.

Referring to FIG. 2A, the process forms an epitaxial substrate E1 by growing semiconductor layers 13 on a primary surface 11a of the semiconductor substrate 11. The semiconductor layers 13 include three layers, 15-19, each made of group III-V compound semiconductor material. The growth of the semiconductor layers 13 may be carried out by the OMVPE technique. In an embodiment where the growth of the layers 13 are carried out on the tin (Sn) doped InP substrate with 2 inches diameter, the layer 15 may be an n-type buffer layer made of n-type InP with a thickness of about 300 nm, the layer 17 may be the grating layer made of n-type InGaAsP with a thickness of about 50 nm, and the layer 19 may be the cap layer made of n-type InP with a thickness of about 30 nm.

Figure 2B:
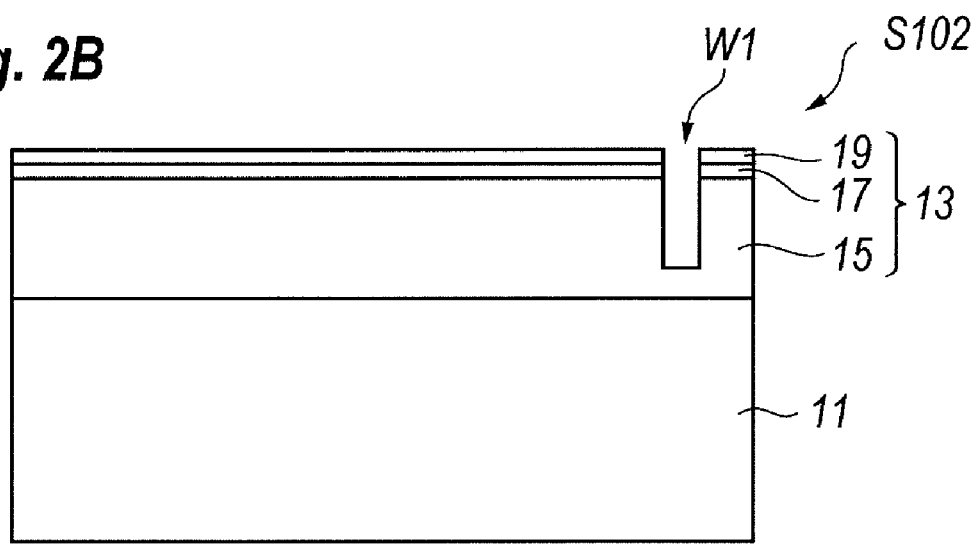

In step S102, the process may form an alignment mark W1 on the epitaxial substrate E1 as shown in FIG. 2B. The alignment mark W1 may be a groove formed in the substrate E1 as follows: (a) first foaming an insulating mask made of, for instance, silicon nitride (SiN) with a pattern for the alignment mark on the epitaxial substrate E1 by the chemical vapor deposition (CVD), and next etching the semiconductor layer 13 by the reactive ion etching (RIE) using the insulating mask to transcribe the pattern. The RIE may use a mixture of methane ($CH_4$) and hydrogen ($H_2$) as an etchant. The insulating mask is removed after the RIE by, for instance, fluoric acid (HF).

In step S103, a plurality of periodic patterns are formed by etching the semiconductor layers 13 using an etching mask. The periodic patterns correspond to the diffraction grating with various diffraction pitches.

Figure 3A:
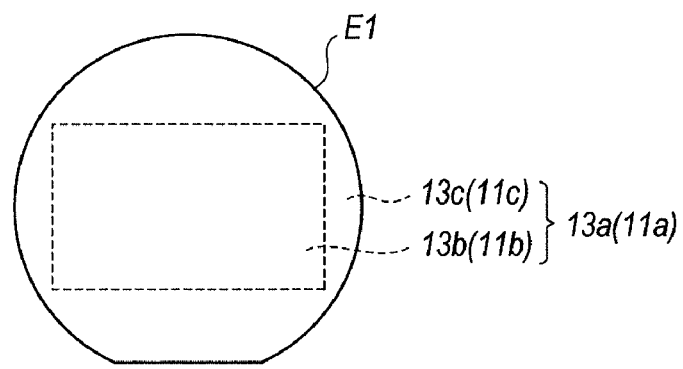
FIG. 3A indicates two areas of the semiconductor substrate, a center area of which is formed with periodic structures, while, a peripheral are of which is formed with an alignment mark.
Figure 3B:
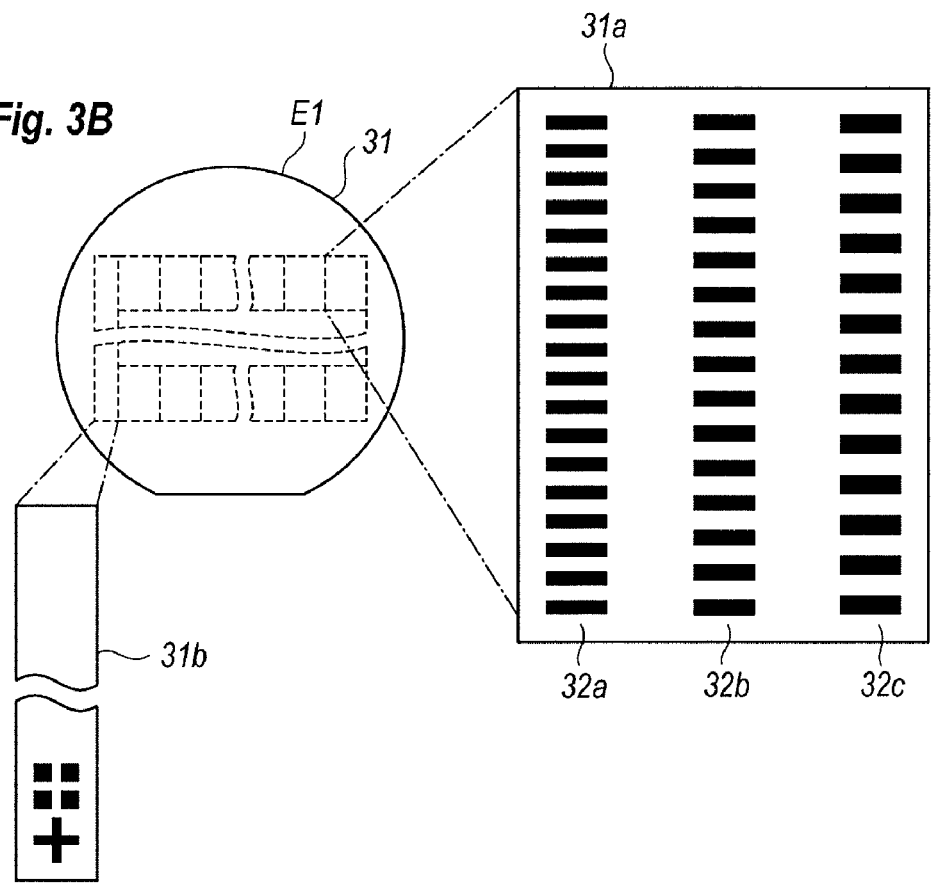
FIG. 3B magnifies the periodic structures and the alignment mark.

The process first forms the mask 31. As shown in FIG. 3A, the epitaxial substrate E1 provides two areas, 13b and 13c, in the semiconductor layers 13. Two areas, 13b and 13c, each correspond to areas, 11b and 11c, of the semiconductor substrate 11. The first area 13b provides an array of the optical devices; while, the second area 13c is formed with patterns such as the alignment mark different from those of the optical device. The alignment mark W1 is formed in the second area 13c; while, the first area 13b of the semiconductor layers 13 provides the device array. As shown in FIG. 3B, the etching mask 31 may be formed on the surface 13a of the semiconductor layers 13. The etching mask 31 may provide the first pattern 31a and the second pattern 31b, the former of which 31a is formed in the first area 13b, while, the latter 31b is formed in the second area 13c. The first pattern 31a includes a plurality of patterns, where FIG. 3C only shows three patterns, 32a to 32c. These patterns, 32a to 32c extend along the same direction and have respective periods each adjusting the detuning amount determined in step S101.

The etching mask 31 may be formed by one of the interference exposure, the EB-exposure, or the nano-imprint technique. In the case of the EB-exposure, a photo-resist 35 for the EB-exposure is first deposited on the insulating film 21 made of silicon di-oxide ($SiO_2$). The apparatus of the EB-exposure detects the alignment mark W1 in the second area 13c, and draws patterns for the etching mask 31 in respective positions by the alignment mark W1 as the reference. The patterns drawn by the EB exposure include the first pattern 31a and, if necessary, other patterns, for instance, for the other alignment mark to form a mesa stripe in subsequent process steps.

In the case of the interference exposure, the etching mask 31 may be formed by: first forming an insulating mask with an opening aligned with an area on the epitaxial substrate E1 where a periodic pattern with a preset pitch is to be formed; and next forming the patterns with the preset pitch in this area by the interference exposure. Subsequently, another insulating mask is formed by the interference exposure. The other insulating mask also has an opening aligned with an area on the epitaxial substrate E1 where a periodic pattern with a preset pitch but different from the former pitch is to be formed. Iterating the formation of the insulating mask with the pattern using the interference exposure, the etching mask 31 may be obtained, where the mask 31 provides a plurality of patterns each having a specific period different from the others within the preset area. The interference exposure may facilitate the process to form the etching mask compared with the EB exposure.

Figure 4A:
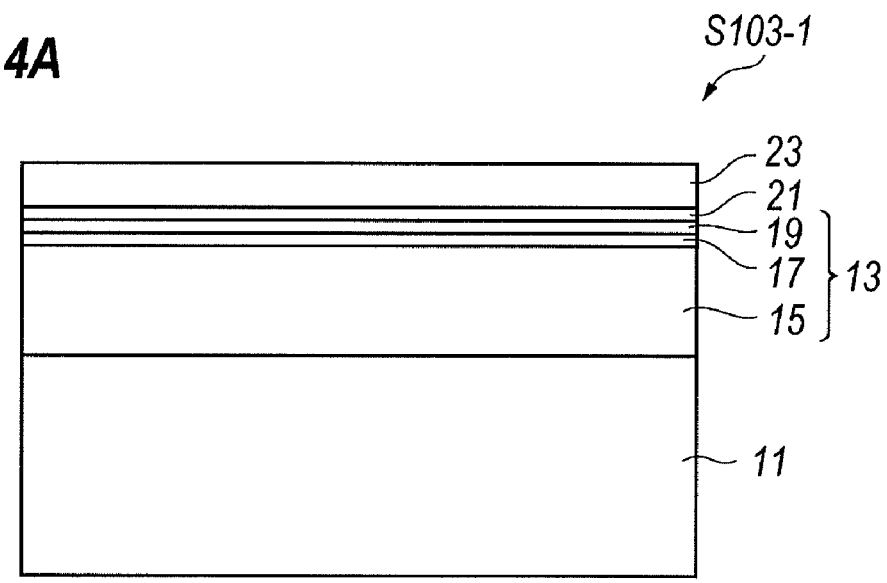
FIGS. 4A and 4B are cross sections each showing the process to form the diffraction grating.
Figure 5:
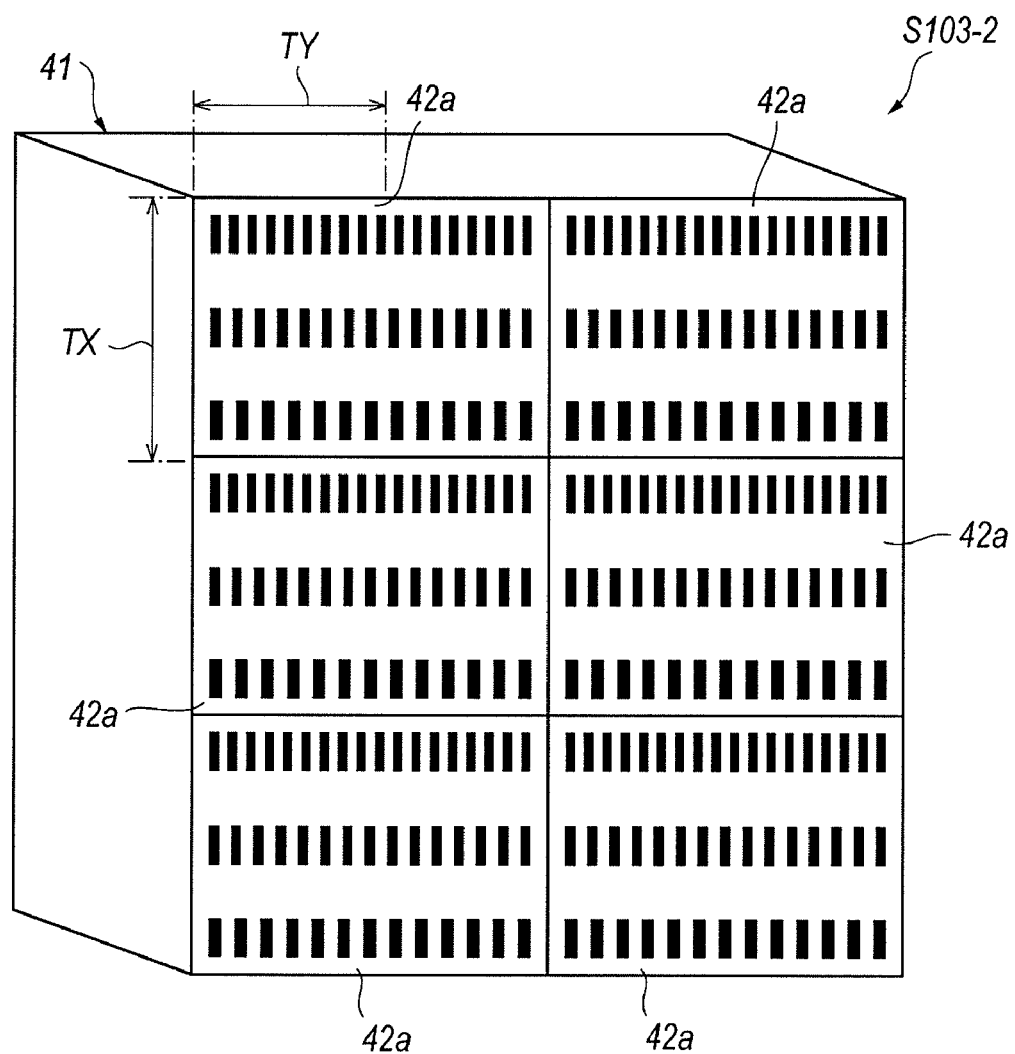
FIG. 5 shows an example of the mold used in the nano-imprint technique.

In the case of the nano-imprint technique, the process first forms an insulating film 21 on the surface 13a of the semiconductor layers 13 at step S103-1 as shown in FIG. 4A. The insulating film 21 may be made of silicon oxy-nitride (SiON) with a thickness of about 50 nm formed by the CVD technique. The process may prepare a mold 41 shown in FIG. 5 at step S103-2. One surface 41a of the mold 41 provides the first pattern 42a, and if necessary, the surface 41a may further provide the second pattern in an area different from the area where the first pattern 42a is formed. The second pattern may include the second alignment mark used to form the mesa stripe. The first pattern 42a is arrayed on the surface 41a; specifically, the first pattern 42a has a first pitch TX along the first direction and a second pitch TY along another direction perpendicular to the first direction, which are equal to the chip size of the semiconductor optical device. The first pattern 42a includes a plurality of periodic patterns each reversing the positive to the negative and having different pitches each other to adjust the detuning amount of the diffraction grating.

In step S103-1, the nano-imprint process first forms the insulating film 21 on the epitaxial substrate E1, as described above, which is finally converted into a hard mask and may be made of SiON. Next, a resin is coated on the semiconductor layer 13a to form a resin body 23 for the nano-imprint technique. The resin body 23 may be made of ultraviolet curable resin or a thermo plasticity resin.

Figure 4B:
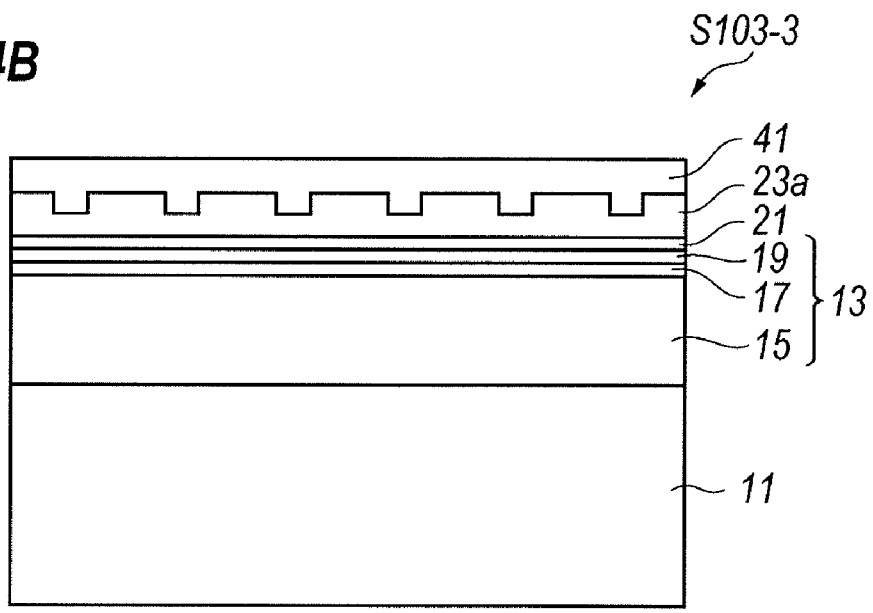

In step S103-3, the nano-imprint process aligns the position of the mold 41 by measuring the position of the alignment mark W1 formed in the second area 13c. As shown in FIG. 4B, by pressing the mold 41 against the resin body 23, the pattern formed on the mold 41 may be imprinted onto the resin body 23 in a preset position. Specifically, when the resin body 23 is made of thermo plasticity resin, the resin body 23 may be softened by increasing a temperature thereof to the glass transition point or higher. By pressing the mold 41 against the softened resin body 23, and decreasing the temperature thereof to a point where the resin body is caked while holding the mold 41 in contact with the resin body 23, the pattern provided on the surface of the mold 41 may be imprinted onto the resin body 23. When the resin body 23 is made of ultraviolet curable resin, first pressing the mold 41 against the gelled resin body 23 in an ordinary temperature and irradiating ultraviolet rays on the resin body 23 while holding the mold 41 in contact with the resin body 23 to harden the gelled ultraviolet resin, will imprint the pattern on the mold 41 onto the resin body 23. In this process, the mold 41 is necessary to be made of material transparent to the ultraviolet rays, typically, the mold 41 may be made of silica glass. Iterating the deposition of the resin body 23 and pushing the mold 41 against the deposited resin body 23 as stepping the mold 41 by the preset pitch, if necessary, the nano-imprint process described above may imprint the pattern of the mold 41 onto the resin body 23 coating the surface 13a of the semiconductor layers 13 to form the etching mask 23a with the imprinted pattern. The etching mask 23a thus formed may provide the first pattern 42a, which corresponds to the first pattern 31a formed by the interference exposure or the EB exposure. The nano-imprint process may enhance the throughput of the process.

Figure 6A:
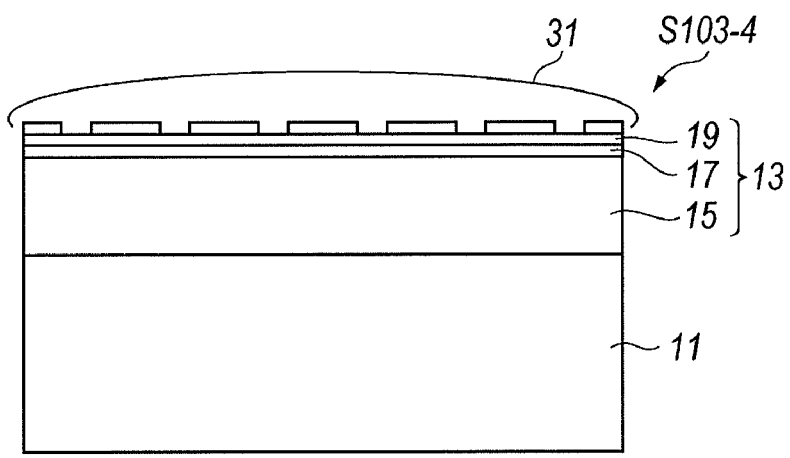
FIGS. 6A to 6C show processes of the invention subsequent to the formation of the diffraction grating.

In step S103-4, the process etches the insulating film 21 using the mask, for instance, the resin mask 23a, to form the hard mask 31 shown in FIG. 6A. The RIE may be applicable to etch the insulating film 21. When the insulating film 21 is made of SiON, the methane ($CH_4$) is effective as an etchant. The resin mask 23a is removed after forming the hard mask 31.

Figure 6B:
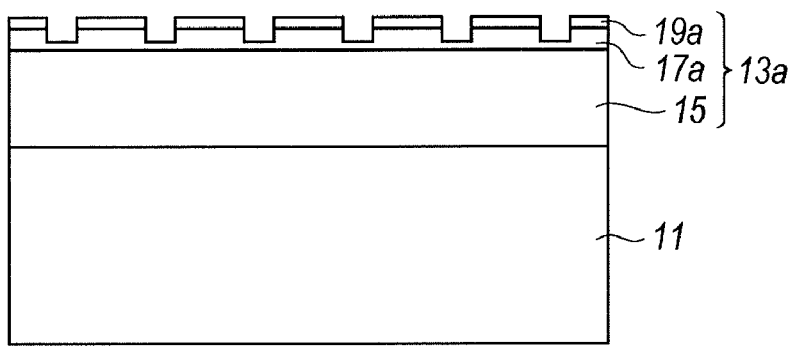

Subsequent to the formation of the hard mask 31, the process forms the cap layer 19a and the grating layer 17a by etching the semiconductor layers, 19 and 17, for a preset time as shown in FIG. 6B. The RIE may be also applicable to this etching. When the hard mask 31 is made of SiON, the RIE may use a mixture of methane ($CH_4$) and hydrogen ($H_2$) as an etchant. The hard mask 31 is removed after the etching of the semiconductor layers, 19 and 17, by fluoric acid. The semiconductor layers 13a thus formed includes the cap layer 19a, the grating layer 17a and the original layer 15.

Figure 7:
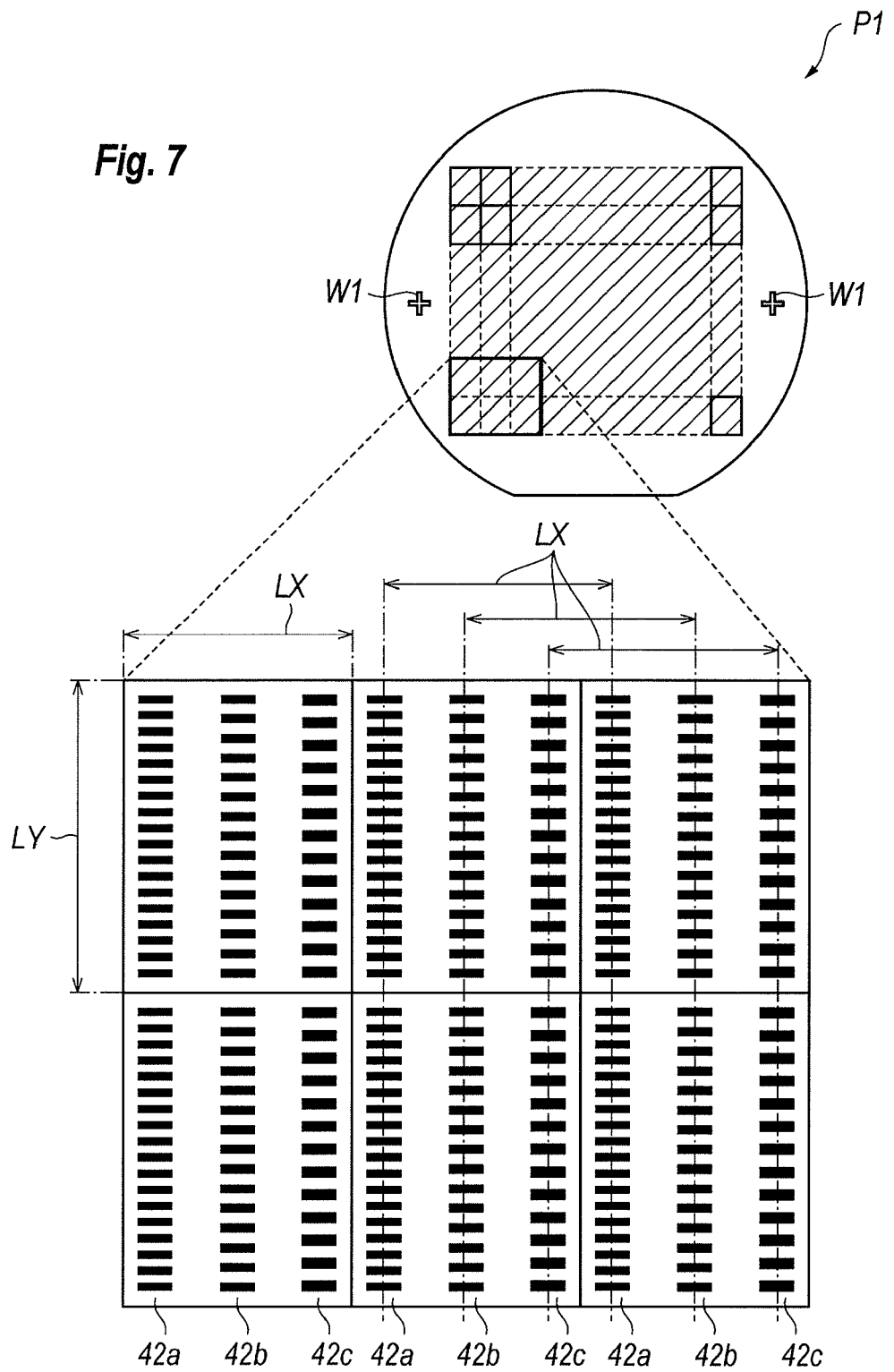
FIG. 7 exemplarily show the arrangement of the diffraction gratings in an unit cell with dimensions of LX and LY, where they are identical with the chip size of the device.

FIG. 7 is a plan view showing an intermediate product after the formation of the cap layer 19a and the grating layer 17a. The intermediate product P1 includes the processed semiconductor layers 13a. Magnified view indicated by the broken line in FIG. 7 illustrates a block including six (6) areas arranged by three in horizontal and two in vertical. Each area provides three periodic patterns, 42a to 42c, each showing a specific diffraction pitch different from the others and extending in substantially parallel. As described above, these periodic patterns, 42a to 42c, have a period specific to the pattern and slightly different to others to show a variable detuning amount. Preferably, the period of respective patterns has an even interval.

The target peak wavelength of the optical gain in the active layer, where the peak wavelength corresponds to the peak wavelength of the photoluminescence when the active layer is optically excited, is set to be, for instance 1308 nm, with a scattering of ±6 nm between batches. Accordingly, the range of the peak wavelength of the optical gain becomes 1302 nm to 1314 nm including the fluctuation. Setting the detuning amount, which is the difference between the peak wavelength of the optical gain and the oscillation wavelength of the laser diode, to be −2 nm, that is the oscillation wavelength is longer than the luminescence wavelength, the target Bragg wavelength of the diffraction grating, at which the laser diode oscillates, is necessary to be set from 1304 nm to 1316 nm, which results in the central value of the pitch of the Bragg grating to be $\Lambda_0$=202.00 nm, and the pitch difference between neighboring gratings to be $\Delta\Lambda$=0.15 nm. Preparing fifteen (15) Bragg gratings having specific pitches of $\Lambda_0-7\Delta\Lambda$, $\Lambda_0-6\Delta\Lambda$, ..., $\Lambda_0$ ... $\Lambda_0+6\Delta\Lambda$, and $\Lambda_0+7\Delta\Lambda$, the oscillation wavelengths from 1301 to 1317 nm of the laser diode may be covered and a fluctuation ±4 nm of the oscillation wavelength may be also compensated.

Adjustment of the detuning amount makes it possible for the light-emitting device operable not only between −5 to 85° C. but between −40 to 85° C., that is, the operating temperature of the device may be expanded to −40° C.

Referring to FIG. 7 again, the periodic patterns, 42a to 42c, each having the specific pitches are horizontally arranged by a step LX which is equal to the size of the device, while they are also vertically arranged by a step LY also equal to the device size, where FIG. 7 illustrates only two (2) arrays vertically. Thus, all type of the periodic structures, 42a to 42c, are included in an optical device whose length is LX in horizontal direction as far as the original device position refers to one of periodic structures. The cap layer 19a may be removed after the formation of the periodic structures, if necessary.

Figure 6C:
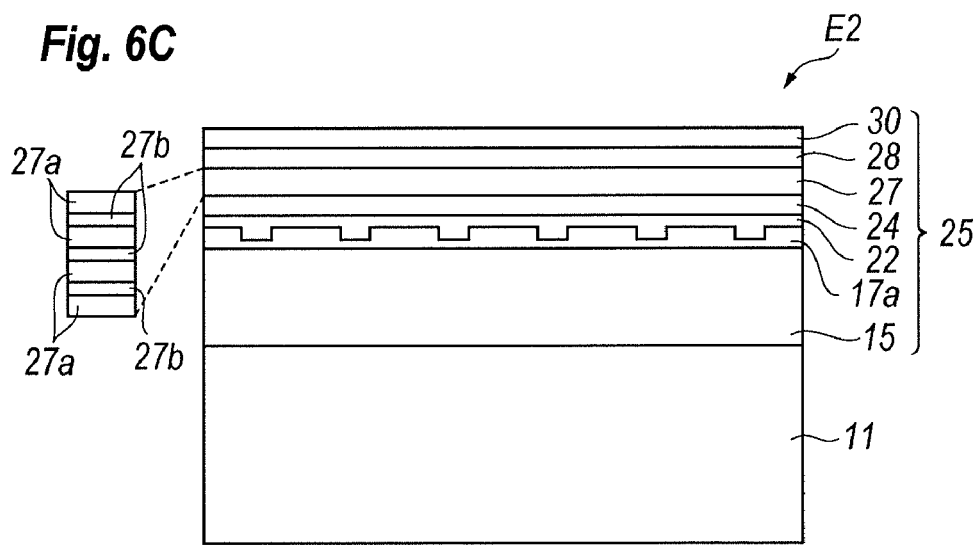

The step S104, as illustrated in FIG. 6C, further grows a semiconductor stack 25 on the periodic structure 42a to 42c after removing the hard mask 31 to prepare an epitaxial substrate E2. The semiconductor stack 25 includes an active layer 27 and other layers, 22, 24, 28 and 30. Specifically, the layer 22 may be an n-type cladding layer made of n-InP, the layer 24 may be an optical confinement layer made of undoped GaInAsP with a thickness of about 50 nm, the layer 28 may be an optical confinement layer made of undoped GaInAsP with a thickness of about 50 nm, and the layer 30 may be a cap layer made of undoped InP. The active layer 27 may be a semiconductor mono-film but preferably has the quantum well structure with a plurality of barrier layers 27a and a plurality of well layers 27b alternately arranged to each other. In an preferable embodiment, the barrier layers 27a may be made of GaInAsP with a band gap wavelength of about 1100 nm and a thickness of about 10 nm, while, the well layers may be made of GaInAsP whose composition is adjusted such that the photoluminescence wavelength thereof becomes 1307 nm, and a thickness thereof may be 5 nm.

Step S105 evaluates the optical gain in the active layer 27. The evaluation of the peak wavelength of the optical gain may be carried out through an analysis of photoluminescence spectra. Two-dimensional distribution of the photoluminescence within the whole substrate E2 may be evaluated. The optical gain becomes the maximum at the peak wavelength in the photoluminescence spectrum.

Step S106 selects one of the periodic structures, 42a to 42c, based on the evaluation carried out in step S105. For instance, an average of the peak wavelength of the photoluminescence spectra measured within the whole of the epitaxial substrate E2. The detuning amount may be automatically determined by the selection of the periodic structure.

Figure 8:
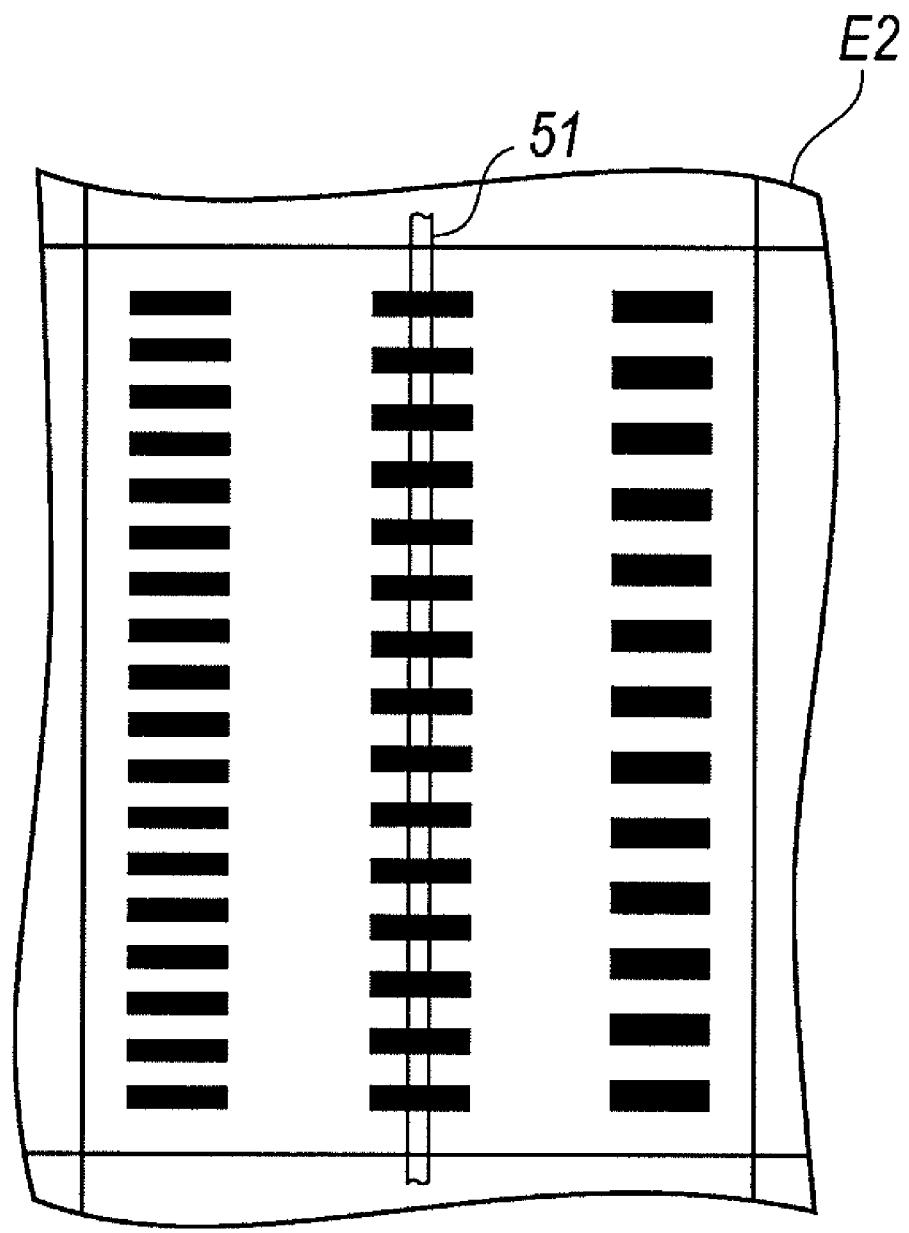
FIG. 8 shows a process where a pattern for the mesa stripe is aligned with the selected diffraction grating.
Figure 9A:
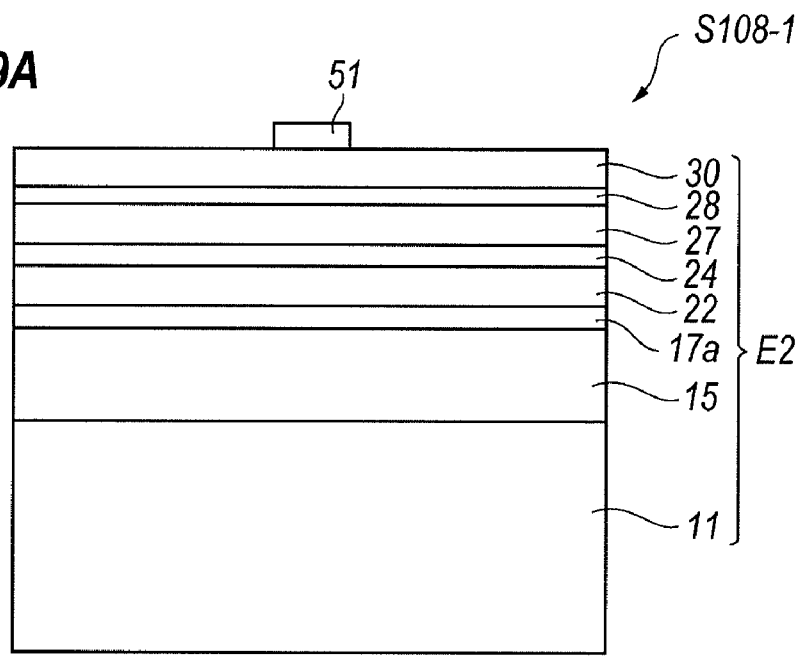
FIGS. 9A and 9B show processes to form the mesa stripe.

Step S107 forms a mechanism to confine carriers. The process first forms the second mask 51 with a longitudinal pattern on the selected periodic structure to form a mesa stripe. As illustrated in FIG. 8, the one of the periodic structures, 42a to 42c, where the center structure 42b is selected in FIG. 8, provides the second mask 51 thereon. FIG. 9A is a cross section shown the second mask 51 formed on the center structure 42a in FIG. 8. The second mask 51 defines the extending direction and the width of the mesa stripe. The mask 51 may be aligned with the selected structure 42b by referring the alignment mark W1, or the second alignment mark prepared in the step same with those formed concurrently with the formation of the periodic structures. The second mask 51 may be made of inorganic material, typically silicon dioxide ($SiO_2$). The RIE may form the copy a striped photo-resist pattern on the $SiO_2$. The patterned photo-resist may be removed after the etching.

Figure 9B:
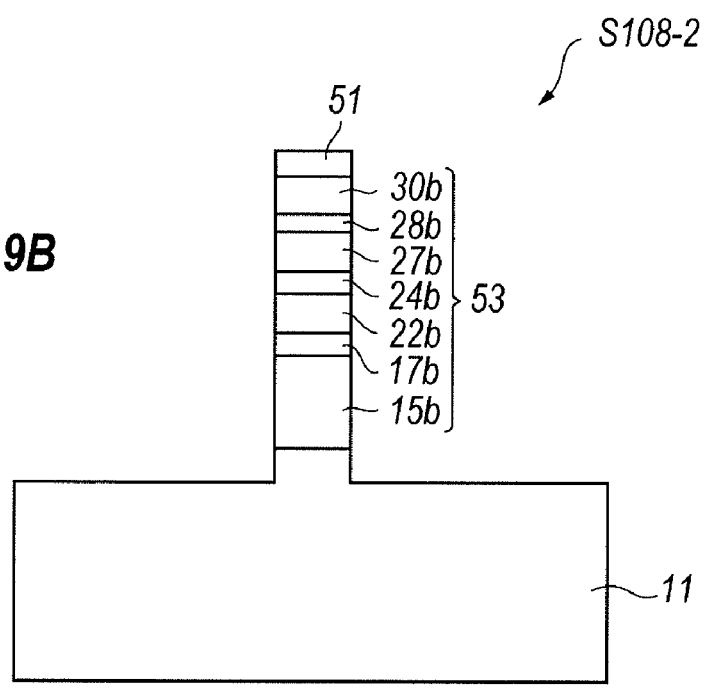
Figure 10A:
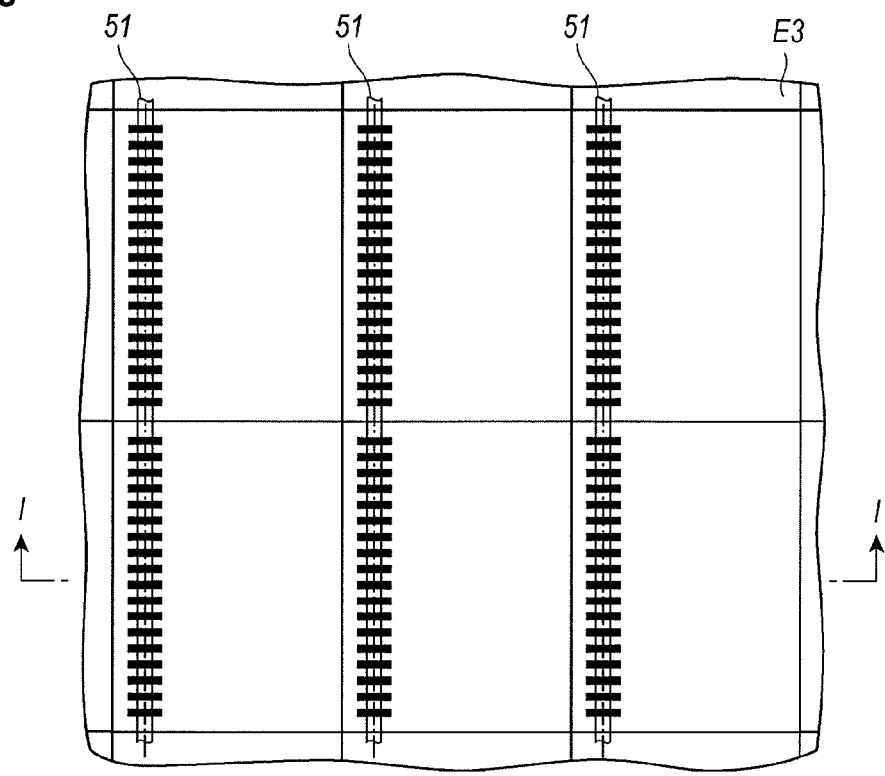
FIG. 10A is a plan view of the intermediate product where one of diffraction gratings is selected.

Step S108-2 etches the epitaxial substrate E2 using the second mask 51 as shown in FIG. 9B to form the mesa stripe 53. The mesa stripe 53 thus formed includes semiconductor layers, 15b to 30b. A dry-etching using the RIE and a wet-etching using a solution such methanol bromide may be applicable to the etching of the semiconductor layers. As shown in FIG. 10A, the stripe mesas thus formed each includes the specific periodic structure, 42a in FIG. 10A, the stripe mesa is also periodically arranged with the period LX same with the size of the optical device. Accordingly, the size of the optical device is unchanged even it includes a plurality of periodic structures.

Figure 10B:
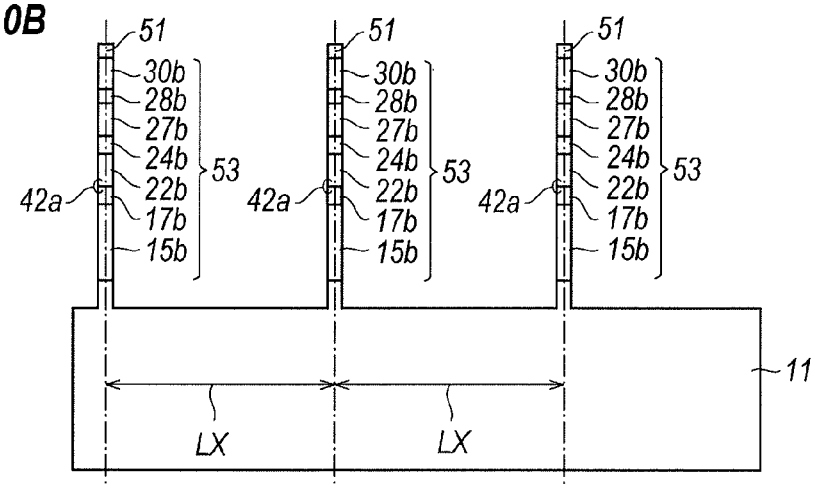
FIG. 10B is a cross section of the intermediate product.

Specifically, FIG. 10A is a plan view of the epitaxial substrate with the stripe mesa, while FIG. 10B is a cross section taken along the line I-I in FIG. 10A. As shown in FIG. 10B, the mesa stripe 53 is formed in the periodic structure 41a in this embodiment. The periodic structure 42a contained in the mesa stripe 53 has the pitch, for example, corresponding to the detuning amount of −0.1 nm.

The mesa stripe 53 vertically extends. The mesa stripe 53 is preferable to extend from one end of the first area 11b in the substrate 11 from the other end thereof. In a case where the mesa stripe 53 is interrupted, one device includes two mesa stripes 53.

Figure 11A:
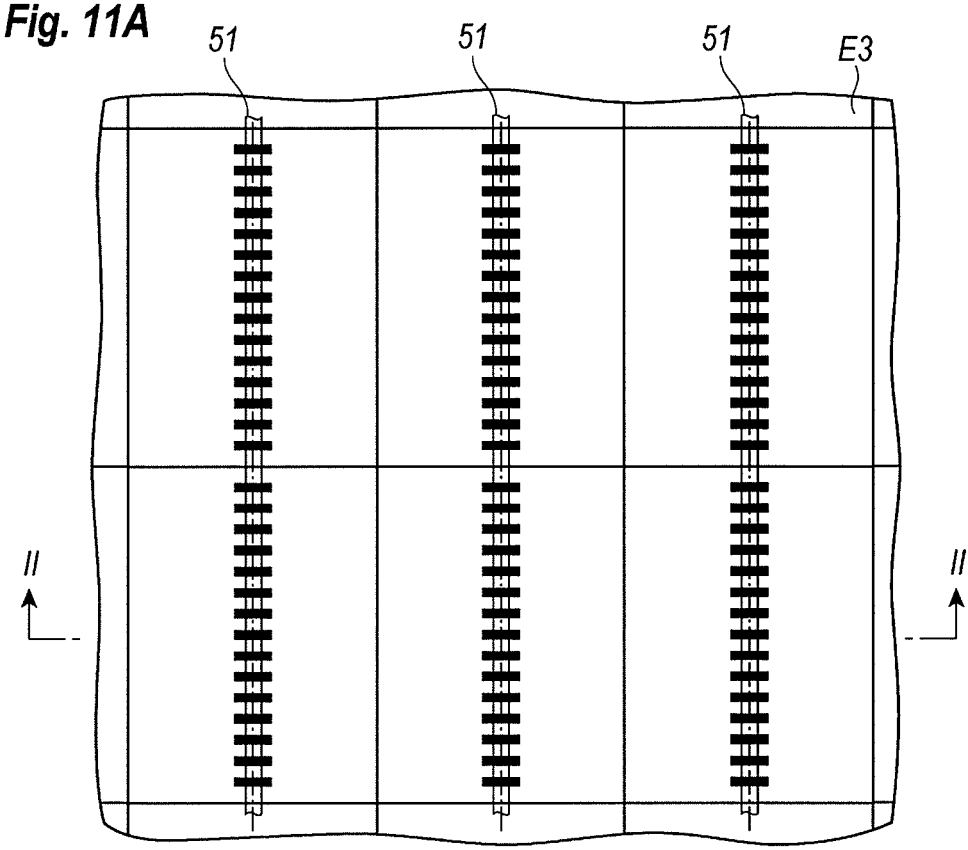
FIG. 11A is a plan view of the intermediate product where the second diffraction grating is selected.
Figure 11B:
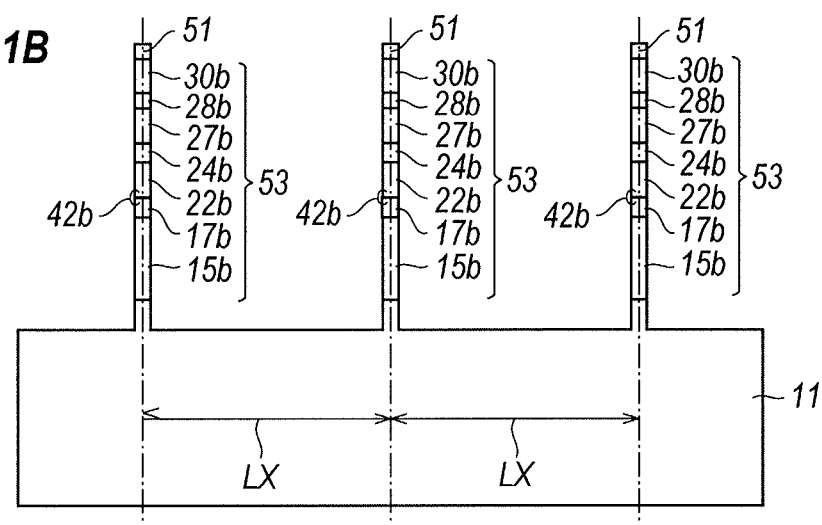
FIG. 11B is a cross section thereof.

FIGS. 11A and 11B show another example of the mesa stripe. FIG. 11A is a plan view of the array of the mesa stripe 53, while FIG. 11B is a cross section taken along the line II-II in FIG. 11A. The optical device shown in FIG. 11A and including the mesa stripe 53 provides the periodic structure 42b with a pitch, for example, corresponding to the detuning amount of +0.05 nm thereof. The mesa stripe 53 shown in 11A is also preferable to extend continuously from the end of the first area to the other end thereof.

Figure 12A:
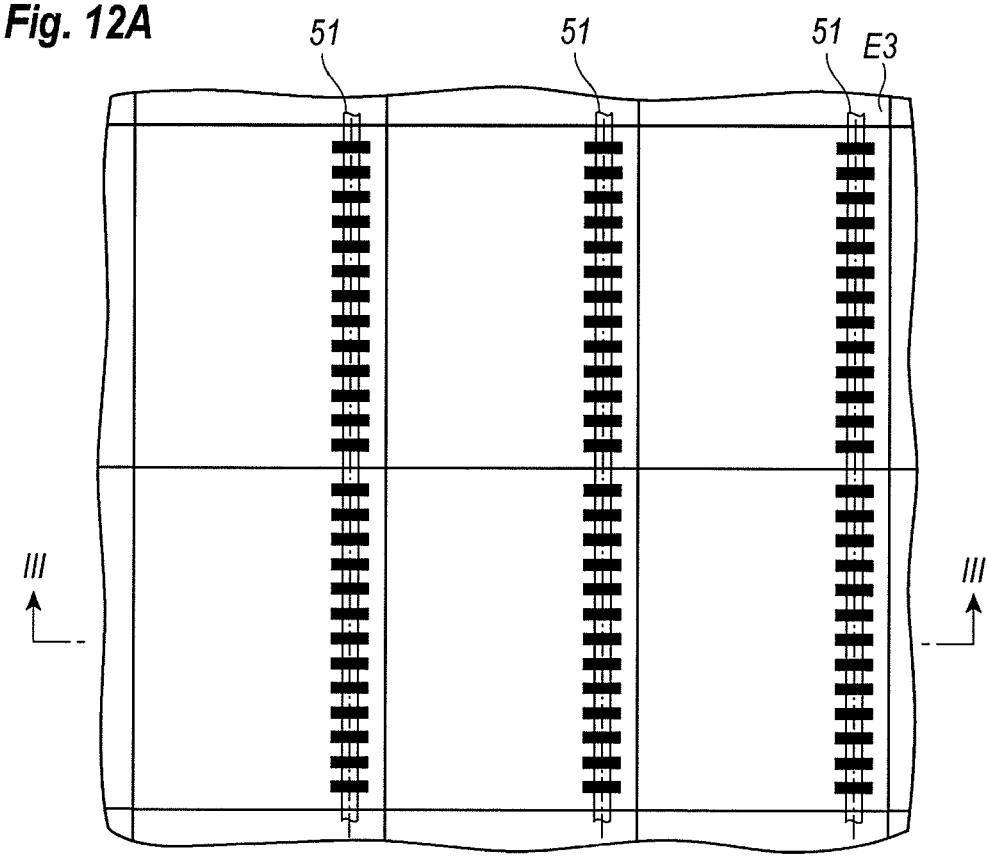
FIG. 12A is a plan view of the intermediate product where the third diffraction grating is selected.
Figure 12B:
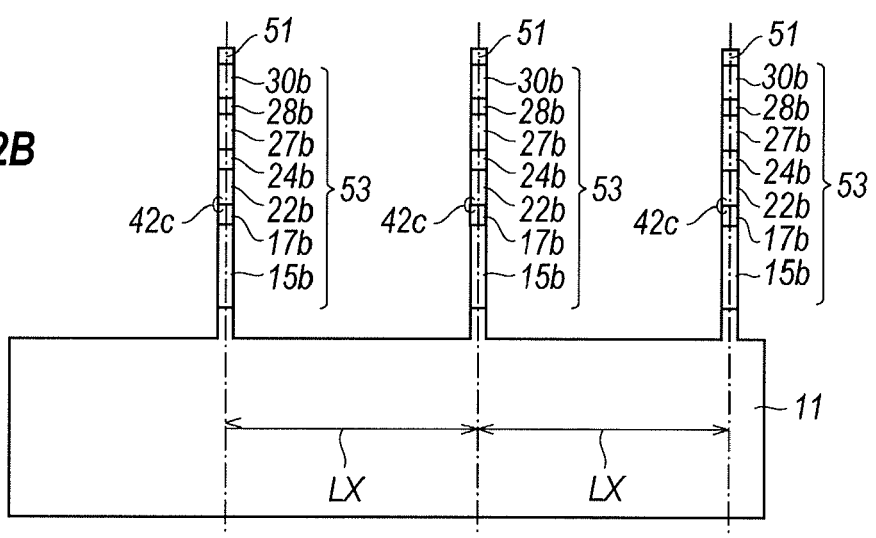
FIG. 12B is a cross section thereof.

FIGS. 12A and 12B illustrate still other embodiment of the array of the mesa stripes. FIG. 12A is a plan view of the array of the mesa stripes each including the corresponding periodic structure 42c, while, FIG. 12B is a cross section taken along the line The optical device shown in FIG. 12A includes the periodic structure 42c with a specific pitch, for example, corresponding to the detuning amount of +0.2 nm thereof. The stripe mesa 53 shown in FIGS. 12A and 12B is also preferable to extend continuously from the end of the first area to the other end thereof.

The process according to the present embodiment may form the one type of the stripe mesa 53 that includes the same periodic structure in the whole first area 11b of the substrate 11, which brings one type of the optical device. In an alternate, the process may form a various stripe mesa each including a specific periodic structure based on the distribution of the photoluminescence spectra measured at step S105, which brings many types of optical devices.

Figure 13A:
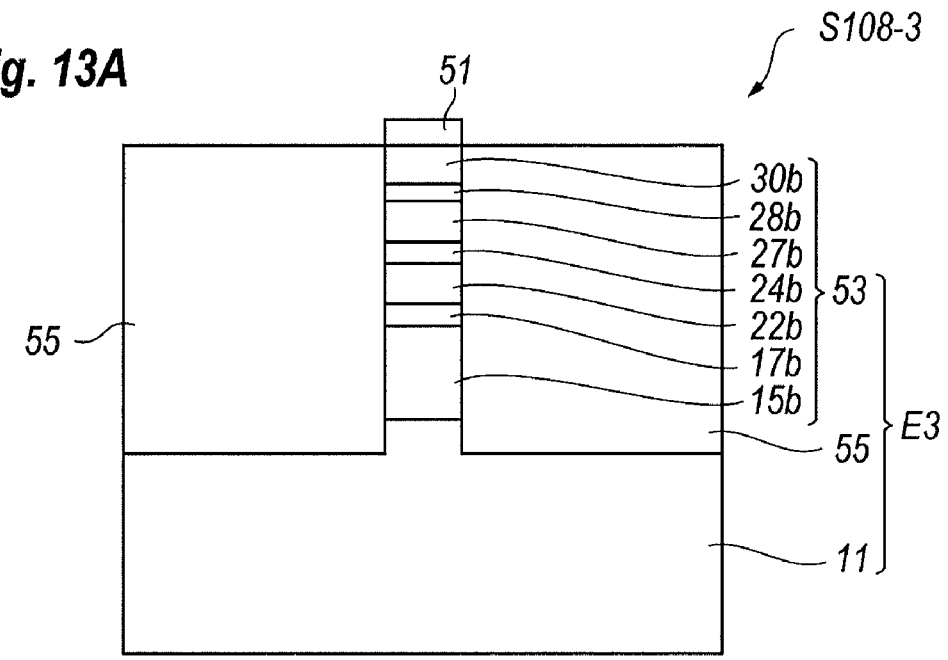
FIGS. 13A and 13B show processes to form the current confinement structure according to the embodiment of the present invention.
Figure 13B:
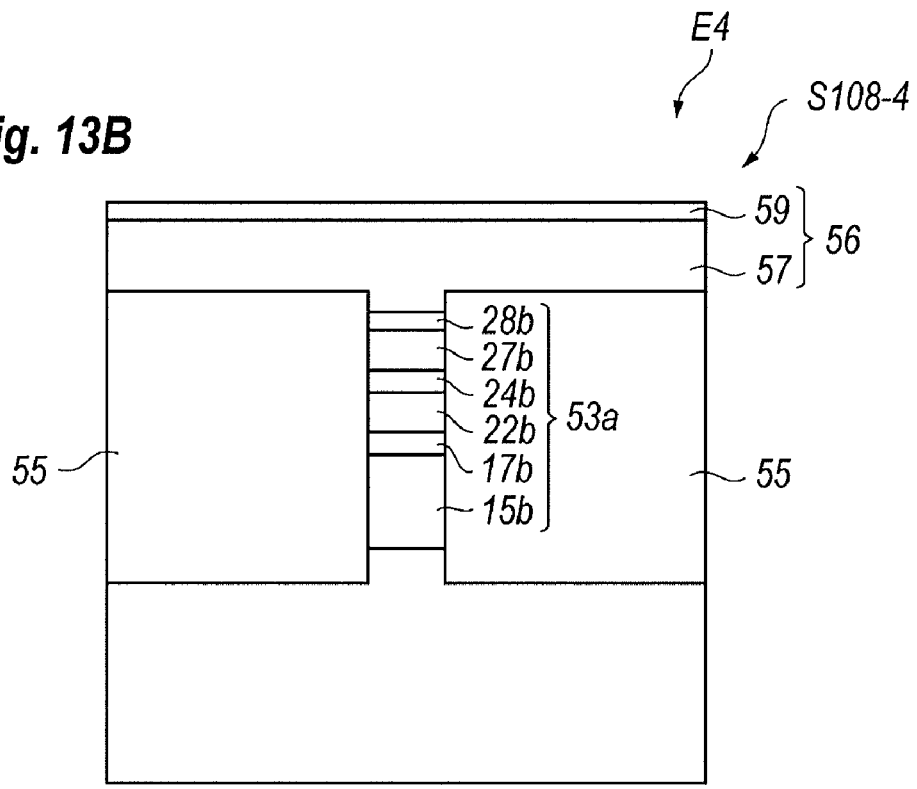

Step S108-3 buries the mesa stripe 53 by using the mask 51 as illustrated in FIG. 13A. The burying layer 55 may include the reversely biased pn-junction or a semi-insulating material. The former burying layer may be formed by steps of: first growing a p-type InP by a thickness of about 1 μm, next growing an n-type InP by a thickness of about 1 μm, and finally growing another p-type InP layer by a thickness of about 0.2 μm. The mask 51 is removed after the growth of the burying layer. The mask, when it is made of $SiO_2$ or SiN, may be easily removed by fluoric acid. Thus, the epitaxial substrate E3 including the stripe mesa 53 and the burying layer 55 is obtained.

The cap layer 30b provided on the top of the mesa stripe 53 may be removed to form another type of the mesa 53a, if necessary. When the cap layer 30b is made of InGaAs, a mixture of phosphoric acid and hydrogen peroxide may selectively remove the InGaAs layer. Step S108-4 grows a p-type layer 56 that includes, for instance, a p-type InP cladding layer 56 and a p-type InGaAs contact layer 59 is grown on the mesa 53a and the burying layer 55 to get the epitaxial substrate E4.

FIG. 14 is a plan view of the epitaxial substrate E4 after the formation of the electrode 57. Step S109 forms the electrode 57 by steps of: first forming an insulating film with an opening in a position above the mesa stripe; second forming a stacked metal of, Ti/Pt/Au in one example, in the opening and on the insulating film by the metal evaporation; and finally removing an extra metal deposited on the insulating film by the lift-off technique. Thus, the intermediate product shown in FIGS. 14A and 14B may be obtained. The ohmic contact to the semiconductor material may be obtained by the thermal treatment of the intermediate product. Plating with gold (Au) on the contact metal, the electrode 57 with a pad 57a is completed. The position of the pad 57a is set so as not to interfere with the breaking line of the intermediate product. Polishing the back surface of the substrate 11 to a thickness of about 100 μm, evaporating eutectic metal of AuGe on the polished back surface, and alloying the eutectic metal, the final products of the optical device may be obtained.

FIG. 14A shows the array of the optical devices each providing the stripe mesa including the periodic structure 42a; while, FIG. 14B shows the array of the optical devices each providing another periodic structure 42b. As shown in FIGS. 14A and 14B, the pad 57a of the electrode 57 is positioned in a center of respective devices.

The process according to the present embodiment proceeds to the dividing step to get a plurality of bars that includes a plurality of device chips. When one bar contains devices each having the same periodic structure, respective device areas extending along the direction perpendicular to the mesa stripe have the same periodic structure, for instance, the structure 42a. The device areas in the other bars may have other periodic structure, for instance, the structure 42c. In any case, the selected periodic structure falls within one device; accordingly, the optical device each having different types of the diffraction grating may be formed by the signal mold 41 by positioning the pad 57a of the electrode 57 so as to set within the signal device chip.

The process according to the embodiment subsequently coats a film on the cleaved facet to adjust the reflectivity at the facet. Then, respective device chips are divided from the bar and the process to manufacture the semiconductor optical device is completed.

The optical device manufactured by the present process may be the DFB-LD, where the diffraction grating thereof is formed between the n-type semiconductor substrate and the active layer. Because of the arrangement of the diffraction grating, the DFB-LD may show relatively lowered differential resistance, in other words, the enhanced slope efficiency. Moreover, as illustrated in FIGS. 15A and 15B, the DFB-LD formed by the present process may show an enhanced saturation current at a high temperature, which means that the DFB-LD shows the maximum optical output power provided by this saturation current. FIG. 15A is an I-L (current vs. optical output power) characteristic of a DFB-LD that arranges the diffraction grating in the p-type semiconductor regions above the active layer; while, FIG. 15B is an I-L characteristic of the DFB-LD with the diffraction grating below the active layer. Thus, the DFB-LD with the diffraction grating below the active layer inherently shows an enhanced I-L characteristic compared with those having the diffraction grating above the active layer.

Moreover, the present invention makes it possible to adjust the detuning amount even for the DFB-LD with the diffraction grating below the active layer, and may suppress the shift of the detuning amount within ±2 nm to the target amount.

Although the description presented above concentrates on the arrangement of the optical device with the stripe mesa, the invention may be applicable to an optical device with the ridge waveguide structure for the current confinement. The ridge waveguide structure is reflected in the second cladding layer on the semiconductor layers 13 and the active layer 27. The ridge waveguide structure is aligned with one of periodic structures, 42a to 42c. Thus, the current to be injected into the active layer may be confined by the ridge waveguide structure, and the periodic structure aligned with the ridge waveguide structure may selectively cause the distributed feedback function. Accordingly, the embodiment of the ridge waveguide structure may adjust the oscillation frequency of the LD to show the designed detuning amount.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for manufacturing a semiconductor optical device, comprising steps of:
    forming lower semiconductor layers on a semiconductor substrate;
    etching said lower semiconductor layers by using an etching mask with a plurality of periodic patterns to form a plurality of diffraction gratings each having a specific pitch equal to respective pitches of said periodic patterns;
    forming an active layer on said etched lower semiconductor layers;
    measuring a peak wavelength of an optical gain in said active layer;
    selecting a selected one of said diffraction gratings based on said measurement of said peak wavelength; and
    forming a current confinement structure aligned with said selected diffraction grating,
    wherein said specific pitch of each of said diffraction gratings is different.

2. The method of claim 1,
    wherein said measurement of said peak wavelength is carried out by measuring a photoluminescence spectrum of said active layer.

3. The method of claim 1,
    wherein said etching mask is formed by a nano-imprint technique including steps of:
    forming an insulating film on said lower semiconductor layers;
    forming a resin body on said insulating film;
    stamping a mold on said resin body, wherein said mold provides a plurality of said periodic patterns on a surface coming in contact to said resin body;
    hardening said resin body as said mold is being pressed against said resin body; and
    etching said insulating film with said patterned resin body as an etching mask.

4. The method of claim 3,
    further comprising a step of preparing an alignment mark in said lower semiconductor layers,
    wherein said step of stamping said mold includes a step of aligning said mold with respect to said alignment mark.

5. The method of claim 4,
    wherein said mold includes another alignment mark reflected in said semiconductor layers by said etching, and
    wherein said step of forming said current confinement structure includes a step to refer to said other alignment mark.

6. The method of claim 3,
    wherein said mold includes an alignment mark reflected in said lower semiconductor layers by said etching, and
    wherein said step of forming said current confinement structure includes a step to refer to said alignment mark.

7. The method of claim 1,
    wherein said optical device has a mesa stripe involving said active layer,
    wherein said step of forming said current confinement structure includes steps of:
    growing upper semiconductor layers on said active layer;
    forming said mesa stripe aligned with said selected one of said diffraction gratings formed in said lower semiconductor layers by etching said upper semiconductor layers, said active layer, and said lower semiconductor layers; and burying said mesa stripe by burying layers,
wherein non-selected diffraction gratings are removed by said etching.

8. The method of claim 1,
wherein said optical device has a ridge waveguide structure,
wherein said step of forming said current confinement structure includes steps of:
growing upper semiconductor layers including an upper cladding layer on said active layer; and
etching said upper cladding layer to form said ridge waveguide structure so as to align with said selected one of said diffraction gratings.

9. The method of claim 1,
wherein said step of forming said lower semiconductor layers includes a step of growing three n-type semiconductor layers on an n-type InP substrate, said three semiconductor layers including an n-type buffer layer made of n-type InP, an n-type grating layer made of InGaAsP and an n-type cap layer made of n-type InP.

10. The method of claim 1,
further comprising a step of, before said step of selecting one of said diffraction gratings, deciding a detuning amount of said active layer.

\* \* \* \* \*